(12) United States Patent
Rivoirard et al.

(10) Patent No.: US 7,345,548 B2
(45) Date of Patent: Mar. 18, 2008

(54) RADIOFREQUENCY AMPLIFIER DEVICE, IN PARTICULAR FOR CELLULAR MOBILE TELEPHONE

(75) Inventors: Frédéric Rivoirard, Fontaine (FR); Jean-Charles Grasset, Moirans (FR)

(73) Assignee: STMicroelectronics S.A., Montrouge (FR)

( * ) Notice: Subject to any disclaimer, the term of this patent is extended or adjusted under 35 U.S.C. 154(b) by 107 days.

(21) Appl. No.: 11/338,618

(22) Filed: Jan. 24, 2006

(65) Prior Publication Data

US 2006/0164172 A1 Jul. 27, 2006

(30) Foreign Application Priority Data

Jan. 26, 2005 (FR) .................................. 05 00797

(51) Int. Cl.
*H03F 3/04* (2006.01)
(52) U.S. Cl. ...................................... 330/311; 330/310
(58) Field of Classification Search ................ 330/311, 330/310, 293, 98, 150
See application file for complete search history.

(56) References Cited

U.S. PATENT DOCUMENTS 5,389,891 A 2/1995 Philippe
5,661,437 A 8/1997 Nishikawa et al.
6,476,680 B2 * 11/2002 Miyabe et al. .............. 330/311
6,965,270 B1 * 11/2005 Ross .......................... 330/311
7,088,187 B1 * 8/2006 Jin et al. .................... 330/311

OTHER PUBLICATIONS

Likittanapong, et al., "Linear CMOS triode transconductor for low-voltage applications," Electronics Letters, IEE Stevenage, GB, vol. 34, No. 12, Jun. 11, 1998, pp. 1224-1225, XP006009939, ISSN: 0013-5194.
Preliminary French Search Report, FR 05 00797, dated Sep. 13, 2005.

* cited by examiner

*Primary Examiner*—Henry Choe
(74) *Attorney, Agent, or Firm*—Gardere Wynne Sewell LLP

(57) ABSTRACT

A radiofrequency amplifier device includes a transconductor stage having an input for receiving a radiofrequency signal, and a cascode stage connected to the output of the transconductor stage. The device also includes an auxiliary radiofrequency amplifier compensation stage connected as a negative-feedback loop between the output of the transconductor stage and the base or the gate of the cascode stage.

22 Claims, 5 Drawing Sheets

RADIOFREQUENCY AMPLIFIER DEVICE, IN PARTICULAR FOR CELLULAR MOBILE TELEPHONE

PRIORITY CLAIM

The present application claims priority from French Application for Patent No. 05 00797 filed Jan. 26, 2005, the disclosure of which is hereby incorporated by reference.

BACKGROUND OF THE INVENTION

1. Technical Field of the Invention

The present invention relates to radiofrequency amplification and more particularly, but not exclusively, to the radiofrequency stages of radiofrequency signal receivers, such as for example cellular mobile telephones operating according to such standards as GSM, CDMA, DCS, etc.

2. Description of Related Art

In radiofrequency receiver or transmitter architectures, the performance on the transconductance value is most often limited by the current flowing within the transconducting element, by its degeneracy and by its load impedance.

For example, in a dual-band receiver of the direct-conversion type, such a transconductor element is used in the low-noise amplifier (LNA) stage.

The performance on the transconductance value of the LNA is essential and conditions parameters such as the noise figure of the mixer situated downstream.

By way of example, if a bipolar transistor arranged in a common-emitter configuration and having a resistive load impedance R on its collector is taken as the transconductor element, it is shown that the transconductance value gm of such an amplifier stage is defined by the ratio of the collector dynamic current over the radiofrequency voltage received on the base of the transistor.

To a first approximation, this transconductance value gm is then equal to:

$$gm_T \frac{1}{1+jCR\omega} \quad (1)$$

where $gm_T$ denotes the transconductance value of the transistor, C denotes the collector-base capacitance of the transistor, R the load impedance of the transistor and $\omega$ the angular radio frequency.

It can therefore be seen that the total transconductance gm is impacted by the transistor base-collector capacitance in addition to the resistive load impedance R.

The resistive load impedance is usually replaced by a cascode transistor connected to the collector of the LNA. The cascode transistor represents the best compromise between the transconductance and the noise figure. Such a solution is for example described in the article by Keng Leong Fong entitled "High-Frequency Analysis of Linearity Improvement Technique of Common-Emitter Transconductance Stage Using a Low-Frequency-Trap Network", IEEE Journal of Solid-State Circuits, Vol. 35, No. 8, August 2000.

Indeed, aside from the fact that the cascode transistor increases the isolation between the LNA amplifier and the mixer situated downstream, it also allows a low dynamic impedance (equal to the inverse of the transconductance of the cascode transistor), compared with the aforementioned load resistive impedance, to be presented to the collector of the amplifier transistor.

One solution for improving the transconductance gm, when a differential configuration is employed, consists in providing capacitive cross-coupling between the LNA collector and the base or the gate of the cascode transistor. This configuration reduces the dynamic impedance presented by the cascode transistor by a factor of two.

Another solution, based on a positive feedback technique, described in the article by Francesco Centurelli et al. entitled "A Bootstrap Technique for Wideband Amplifiers"; IEEE Transactions on Circuits and Systems—I: Fundamental Theory and Applications", Vol. 49, No. 10, October 2002, allows the pole introduced by the base-collector capacitance to be compensated by an anti-pole. This results in an increase in the bandwidth and in the radiofrequency transconductance of the amplifier. Nevertheless, this wideband solution requires a resistive degeneration for the amplifier, which necessarily leads to an increase in the noise figure.

A need accordingly exists to provide a different solution to the problem of improving the transconductance value of a radiofrequency amplifier stage.

SUMMARY OF THE INVENTION

In accordance with embodiments of the present invention, a particularly simple solution is provided that may be implemented in either a single-ended architecture or in a differential architecture. Embodiments of the invention further provide a solution that does not lead to an increase in the noise figure.

Thus, according to one embodiment of the invention, a radiofrequency amplifier device is thus provided that comprises a tranconductor stage comprising an input for receiving a radiofrequency signal, and a cascode stage connected to the output of the transconductor stage.

According to a general feature of this embodiment, the radiofrequency amplifier device also comprises an auxiliary radiofrequency compensation amplifier stage connected as a negative-feedback loop between the output of the transconductor stage and the base or the gate of the cascode stage.

This solution is thus based notably on a negative-feedback effect in the sense that, if the variations in voltage v are present at the input of the compensation amplifier stage, this stage re-injects a voltage equal to −Av, where A denotes the radiofrequency gain of the auxiliary amplifier, onto the base or the gate of the cascode stage. Consequently, by way of this negative-feedback or compensation loop, the auxiliary amplifier stage is able to compensate for the variations in voltage on the output of the transconductor stage, in other words on the collector of the input transistor in one embodiment.

The device may have an architecture of the single-input type.

According to one embodiment of the single-ended type, the cascode stage comprises a cascode transistor and the auxiliary amplifier stage comprises an auxiliary transistor connected in a common-emitter type configuration between the output of the transconductor stage and the base or the gate of the cascode transistor, together with an auxiliary resistor connected to the collector of this auxiliary transistor.

The device also advantageously comprises a bias current source for the auxiliary amplifier stage, connected in series between a power supply terminal and the auxiliary resistor. A radiofrequency decoupling capacitor is furthermore provided that is connected to the terminal common to the current source and to the auxiliary resistor. This means notably that any radiofrequency residue on the bias current source is thus avoided.

As a variant, the device comprises a bias current source for the auxiliary amplifier stage, connected in series between the emitter of the auxiliary transistor and ground, together with a decoupling capacitor connected between the emitter of the auxiliary transistor and ground.

The device according to an embodiment of the invention may also have a differential architecture.

Thus, according to one embodiment of the type with differential architecture, the cascode stage comprises two cascode transistors respectively connected to the two differential output terminals of the transconductor stage. The auxiliary amplifier stage then comprises two auxiliary transistors respectively connected in common-emitter type configurations between the two output terminals of the transconductor stage and the bases or control gates of the two cascode transistors, together with two auxiliary resistors respectively connected to the collectors of these two auxiliary transistors.

Here, a bias current source for the auxiliary amplifier stage is again advantageously provided and is connected in series between a power supply terminal and the collectors of the two auxiliary transistors, preferably together with a radiofrequency decoupling capacitor connected to the terminal common to the current source and to the two auxiliary resistors.

As a variant, the device comprises a bias current source for the auxiliary amplifier stage, connected in series between the emitters of the two auxiliary transistors and ground.

The invention also provides a radiofrequency signal receiver, for example a cellular mobile telephone, incorporating an amplifier device such as is defined hereinafter.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
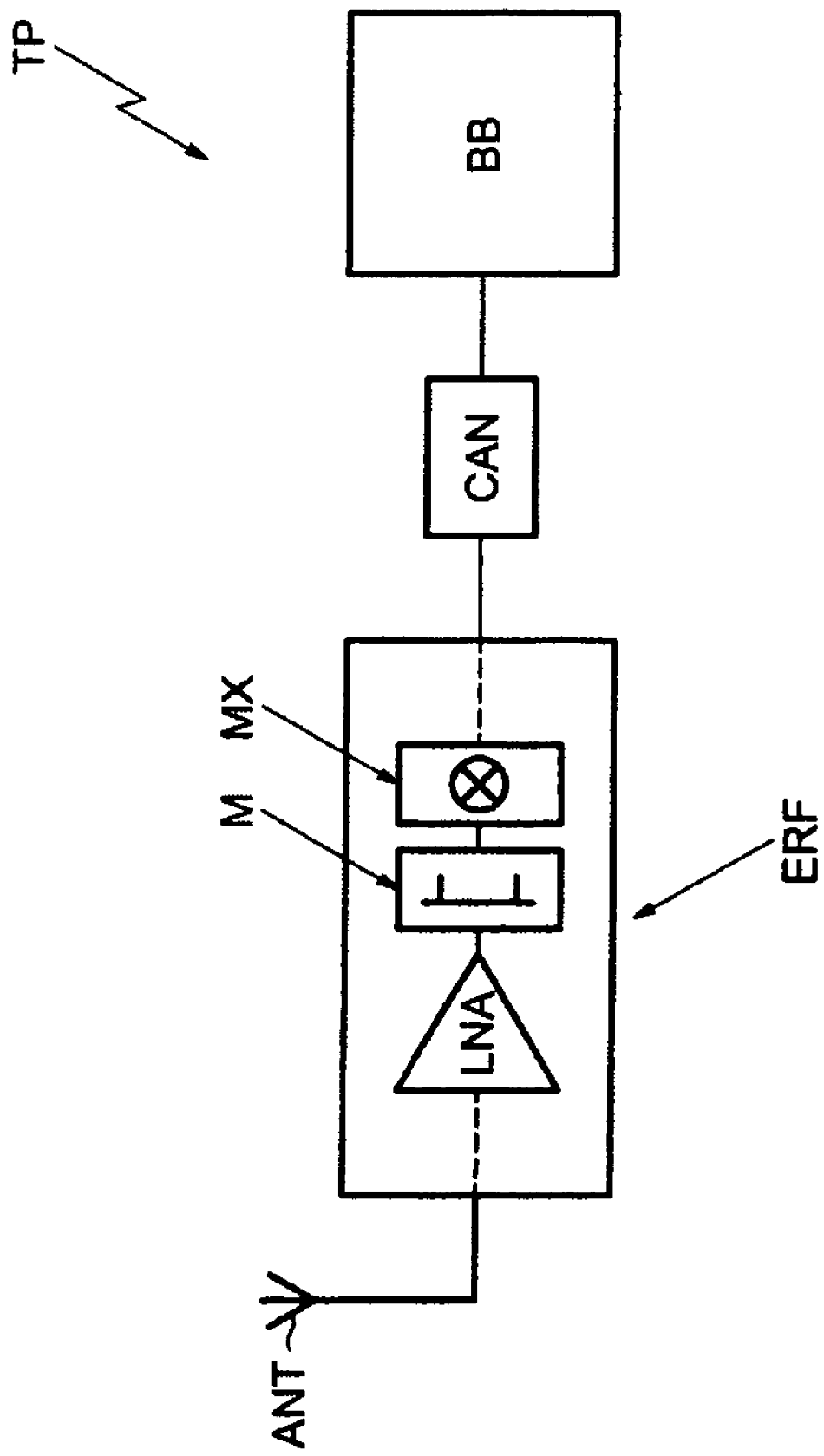
FIG. 1 illustrates schematically an embodiment of a cellular mobile telephone incorporating one embodiment of a radiofrequency amplifier device according to the invention.

In FIG. 1, the reference TP denotes an element of a wireless communications system, such as a radiofrequency signal receiver, for example a cellular mobile telephone.

The telephone TP comprises an antenna ANT connected to a radiofrequency stage ERF comprising a low-noise amplifier LNA connected to a mixer stage MX via a cascode stage M notably providing an isolation between the amplifier LNA and the mixer stage MX situated downstream. Conventionally, the stage ERF also comprises another amplifier element and a filter element (not shown in this figure for the purpose of simplification) connected downstream from the mixer stage.

The output of the radiofrequency stage is connected in a conventional manner known per se to a stage for digital processing in base band BB via an analog-to-digital conversion stage CAN.

Figure 2:
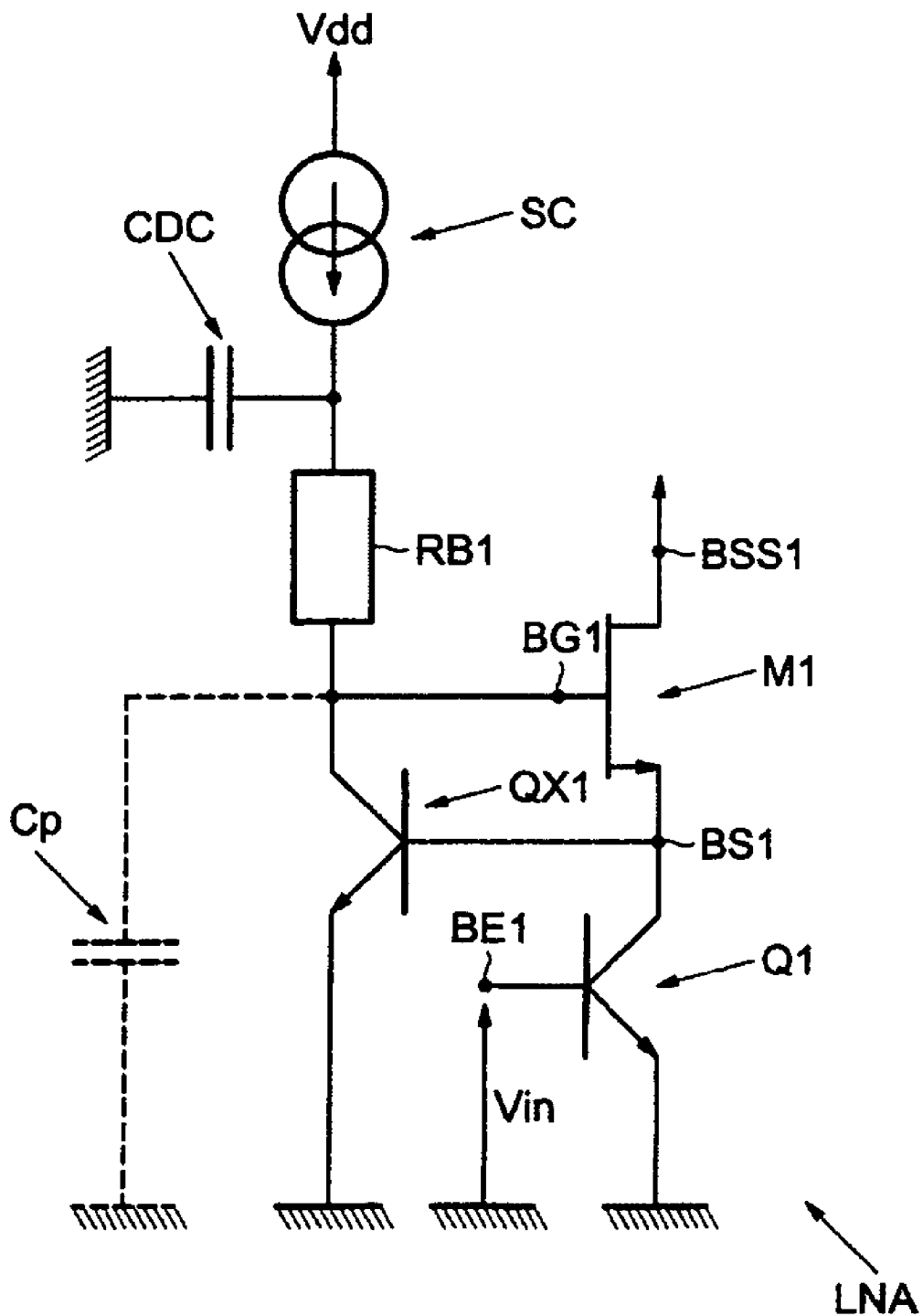
FIG. 2 illustrates in more detail, but still schematically, a first embodiment of a radiofrequency amplifier device according to the invention.

FIG. 2 illustrates in more detail an exemplary embodiment of the amplifier LNA in a single-ended architecture (wherein the LNA is preferably implemented in an integrated circuit fashion).

More precisely, the amplifier device comprises a transconductor amplifier element Q1 formed here from a bipolar transistor arranged in a common-emitter configuration, although a configuration of the common-base type may be envisaged. In the common-emitter configuration, the emitter of the transistor Q1 may also be inductively degenerated, in other words it may be connected to ground via a degeneracy inductor.

In this common-emitter configuration, the input terminal BE1 of the device, connected to the base of the transistor Q1, receives the radiofrequency input voltage Vin.

The output terminal BS1 of the amplifier stage Q1 connected to the collector of the transistor Q1, is connected to a cascode transistor M1 formed here from an NMOS transistor whose drain forms the output terminal BSS1 connected to the mixer stage MX (FIG. 1). The cascode transistor could also be a bipolar transistor.

The amplifier device also comprises an auxiliary amplifier stage here comprising an auxiliary transistor QX1 connected in a common-emitter configuration between the output of the transconductor stage and the control electrode (here the gate) BG1 of the cascode transistor M1.

The auxiliary amplifier stage also comprises an auxiliary resistor RB1 (charge of the amplifier) connected to the collector of the auxiliary transistor QX1 and also to the gate BG1 of the cascode transistor M1.

Here, the auxiliary amplifier is biased by a current source SC connected between the power supply voltage Vdd and the auxiliary resistor RB1.

Furthermore, a decoupling capacitor CDC is connected between ground and the terminal common to the resistor RB1 and to the current source SC. For this reason, the impedance seen from the collector of QX1 is defined by the resistor RB1 and not by that of the current source SC.

The auxiliary amplifier is in fact a compensation amplifier connected as a compensation loop (or negative-feedback loop) between the output BS1 of the transconductor stage Q1 and the control input BG1 of the cascode stage.

The auxiliary amplifier is a radiofrequency amplifier since it exhibits a gain in the radiofrequency range.

More precisely, if voltage variations v are present on the collector of the transistor Q1, and consequently at the input of the transistor QX1, the auxiliary amplifier re-injects a voltage equal to −Av into the base of the cascode transistor M1, where A denotes the radiofrequency gain of the auxiliary amplifier. Consequently, by reason of this compensation loop inducing a negative feedback, the auxiliary amplifier QX1, RB1 is able to compensate for the voltage variations on the collector of the transistor Q1.

The auxiliary compensation amplifier QX1, RB1 is a radiofrequency arrangement having a low gain and a great band width. The low gain is proportional to the product $gm_{QX1}.RB1$. This product is typically about ten and the output impedance is equal to RB1 (typically about 100 or 200 Ohms). Providing a resistor and not an active charge (as for example a current source) as a charge for this amplifier permits to obtain very simply an operation in the radiofrequency domain. As a matter of fact, an active charge having inherently a very great internal resistance value, would lead to a very low auxiliary amplifier's cut off frequency taking into account the parasitic capacitor at the node BG1 (gate of the cascode transistor M1).

The voltage transfer function of the auxiliary compensation amplifier QX1, RB1 is, to a first order, given by the following formula:

$$A(j\omega) = \frac{-gm_{QX1} RB1}{1 + jRB1 \cdot Cp \cdot \omega} \quad (2)$$

in which Cp denotes the stray capacitance provided by the gate-substrate (bulk) capacitance of the cascode transistor M1 and by the collector-substrate capacitance of the transistor QX1.

In practice, the ratio 1/RB1.Cp is very large with respect to the angular radiofrequency ω, for example in a ratio of 10.

It can then be shown that the impedance seen from the collector of the transconductor element Q1 is equal to $1/(gm_{M1}(1+A))$.

For this reason, the impedance seen from the collector of Q1 is therefore divided by the loop gain A (radiofrequency gain of the auxiliary amplifier) with respect to the prior art solution that provides for only a cascode stage to be employed.

Figure 3:
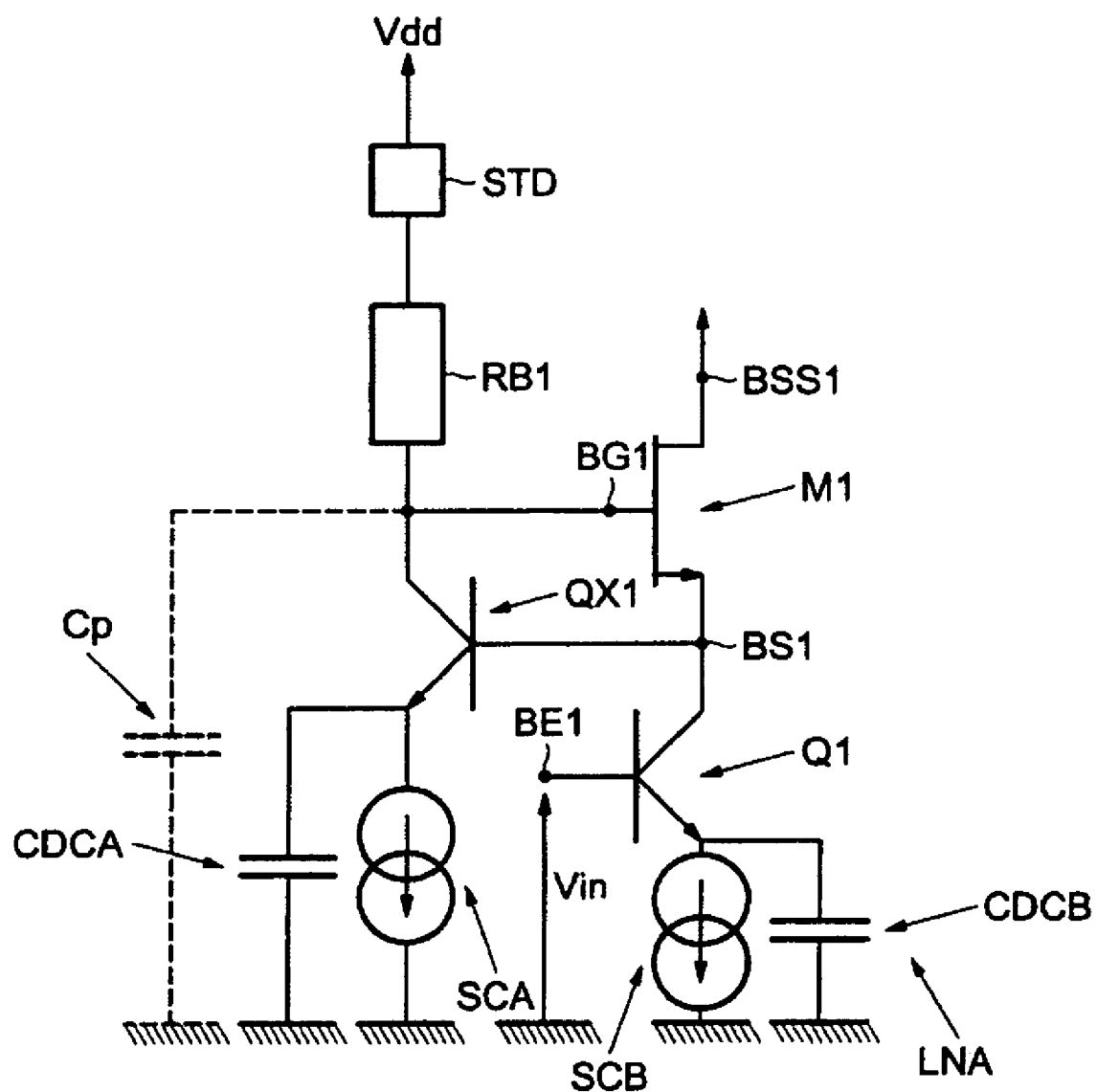
FIG. 3 illustrates in more detail, but still schematically, another embodiment of a radiofrequency amplifier device according to the invention.

FIG. 3 illustrates another embodiment of the invention, using a single-ended architecture, in which the auxiliary amplifier is biased from below.

More particularly, the transistor Q1 is biased by a current source SCB connected between the emitter of Q1 and ground. In order to avoid the saturation of the transconductor stage, the emitter of the transistor QX1 is connected to another current source SCA. Decoupling capacitors CDCA and CDCB are respectively connected between ground and the emitters of the transistors QX1 and Q1. The resistor RB1 is connected to the power supply voltage Vdd via an offset voltage source STD, for example a regulator or any other circuit known per se.

Figure 4:
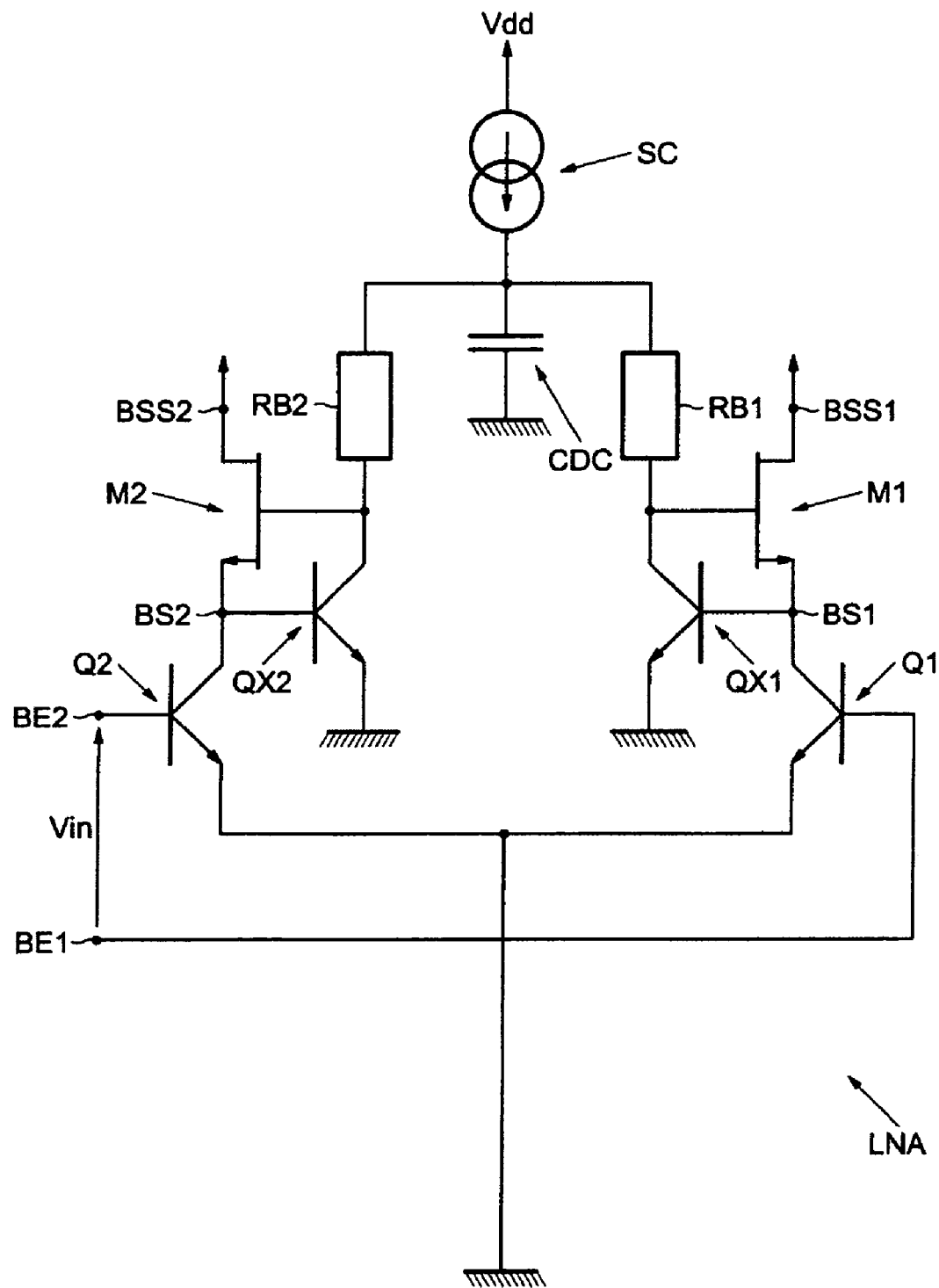
FIG. 4 illustrates in more detail, but still schematically, another embodiment of a radiofrequency amplifier device according to the invention.

The amplifier device according to the invention can also be formed according to a differential architecture such as that illustrated for example in FIG. 4.

It can be seen in this figure that the transconductor stage of the amplifier LNA comprises two transistors Q1 and Q2 configured in common-emitter mode, the radiofrequency input signal (voltage Vin) being applied in differential mode between the two input terminals BE1 and BE2 respectively connected to the bases of the transistors Q1 and Q2.

The emitters of the transistors Q1 and Q2 are connected to ground via a current source SC2.

The output terminals (collectors) of the transistors Q1 and Q2 (referenced BS1 and BS2) are isolated from the output terminals BSS1 and BSS2, connected to the mixer stage, by a cascode stage composed here of two cascode transistors M1 and M2.

The auxiliary compensation amplifier stage comprises, in this embodiment, two auxiliary transistors QX1 and QX2 arranged in a common emitter configuration and respectively connected as a loop between the terminals BS1 and BS2 and the control gates of the cascode transistors M1 and M2.

The two auxiliary amplifiers comprise two auxiliary resistors RB1, RB2 respectively connected in series with the respective collectors of the transistors QX1 and QX2.

The biasing means of the auxiliary amplifier stage also comprise the current source SC connected between the power supply terminal Vdd and the common terminal of the auxiliary resistors RB1 and RB2.

Lastly, a decoupling capacitor CDC is advantageously connected between the common terminal of the resistors RB1 and RB2 and ground.

Figure 5:
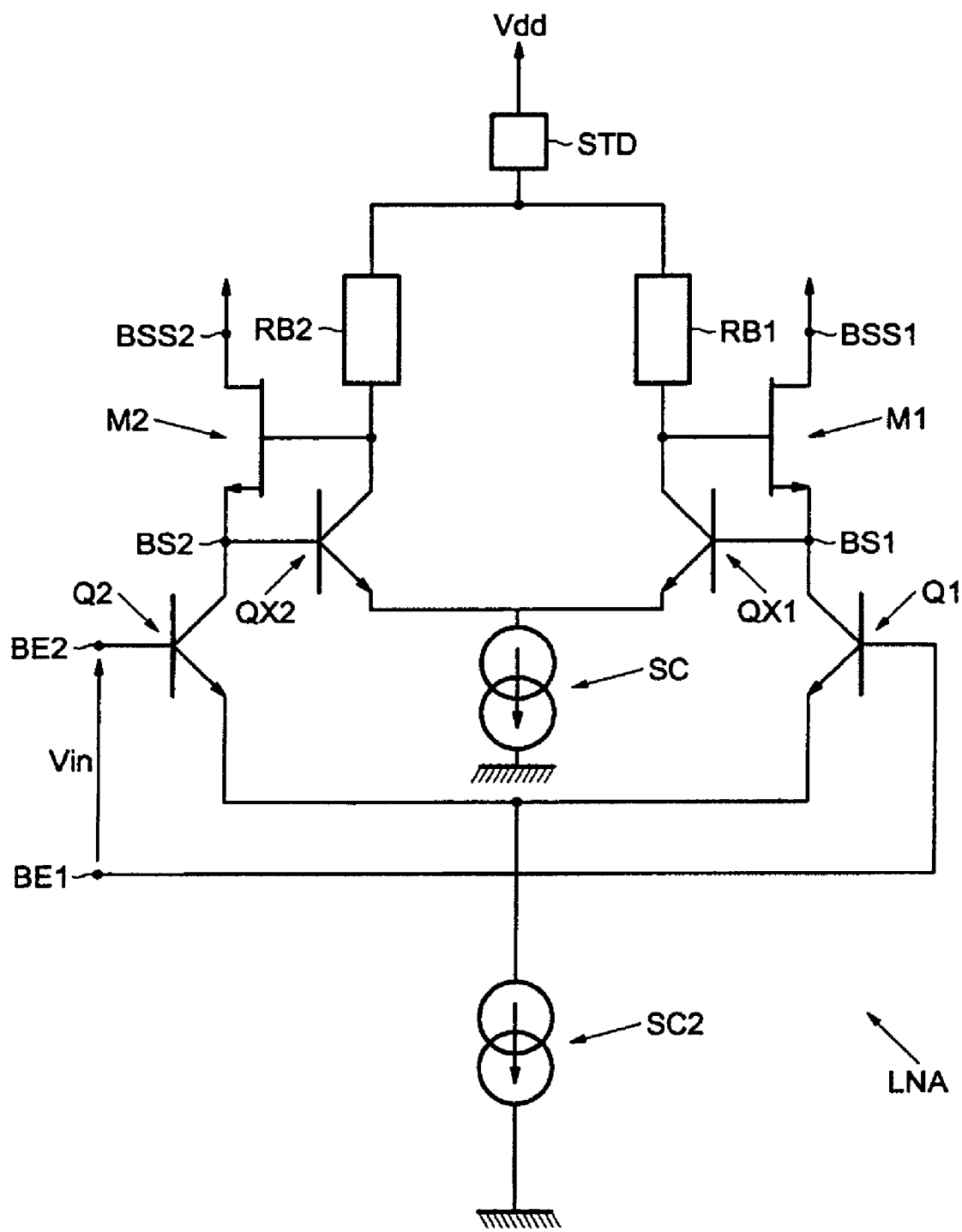
FIG. 5 illustrates in more detail, but still schematically, another embodiment of a radiofrequency amplifier device according to the invention.

FIG. 5 shows another possible differential architecture which is a variant of FIG. 4 and in which the transistors Q1 and Q2 are biased by a current source SC2. In order to avoid the saturation of the transconductor stage, the emitters of the transistors QX1 and QX2 of the auxiliary compensation amplifiers are connected to a current source SC. The resistors RB1 and RB2 are then connected to the power supply Vdd via an offset voltage source STD.

By way of example, the inventors have demonstrated an improvement, for example, of 4 dB in the transconductance value gm at 3 GHz between a prior art amplifier device with only a cascode stage and a device according to the invention equipped with an auxiliary compensation radiofrequency amplifier.

Furthermore, a GSM and DCS dual-band receiver has been implemented with an amplifier stage according to the invention by using a BiCMOS technology. The structure chosen was a differential structure, where each transconductor element was biased with a collector current of 3.5 milliamps. The total current consumption of the auxiliary compensation amplifier stage amounts to 1.2 milliamps, which represents only 7% of the total consumption in the DCS mode. An increase in the transconductor stage gain has also been observed leading to a reduction in the noise of the downstream stages. More precisely, with respect to a prior art solution using a crossed capacitive coupling, an increase in the gain of 2.5 dB and a reduction in the noise factor of 1 dB has been obtained without modifying the linearity of the amplifiers.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A radiofrequency amplifier device, comprising:
   a transconductor stage comprising an input for receiving a radiofrequency signal;
   a cascode stage connected to an output of the transconductor stage and having a control node and further generating an output of the device;
   an auxiliary radiofrequency amplifier compensation stage connected as a negative-feedback loop between the output of the transconductor stage and the control node of the cascode stage.

2. The device according to claim 1, wherein the device has a single-ended type architecture.

3. The device according to claim 2, wherein the cascode stage comprises a cascode transistor, and wherein the auxiliary amplifier stage comprises an auxiliary transistor connected in a common-emitter type configuration between the output of the transconductor stage and the control node of the cascode transistor, together with an auxiliary resistor connected to a collector of this auxiliary transistor.

4. The device according to claim 3, further comprising
a bias current source for the auxiliary amplifier stage, connected in series between a power supply terminal and the auxiliary resistor, and
a radiofrequency decoupling capacitor connected to the terminal common to the current source and to the auxiliary resistor.

5. The device according to claim 3, further comprising:
a bias current source for the auxiliary amplifier stage, connected in series between the emitter of the auxiliary transistor and ground, and
a decoupling capacitor connected between the emitter of the auxiliary transistor and ground.

6. The device according to claim 1, wherein the device has a differential architecture.

7. The device according to claim 6, wherein the cascode stage comprises two cascode transistors respectively connected to two differential output terminals of the transconductor stage, and wherein the auxiliary amplifier stage comprises two auxiliary transistors respectively connected in common-emitter type configurations between the two output terminals of the transconductor stage and the two control nodes of the two cascode transistors, together with two auxiliary resistors respectively connected to the collectors of these two auxiliary transistors.

8. The device according to claim 7, further comprising a bias current source for the auxiliary amplifier stage, connected in series between a power supply terminal and the collectors of the two auxiliary transistors.

9. The device according to claim 8, further comprising a radiofrequency decoupling capacitor connected to the terminal common to the current source and to the two auxiliary resistors.

10. The device according to claim 7, further comprising a bias current source for the auxiliary amplifier stage, connected in series between the emitters of the two auxiliary transistors and ground.

11. The device of claim 1 wherein the device is incorporated within a radiofrequency signal receiver.

12. The device of claim 11, wherein the radiofrequency signal receiver is a part of a cellular mobile telephone.

13. The device of claim 1 wherein the device is an integrated circuit.

14. A circuit, comprising:
a first transistor having a first control terminal and an output terminal;
a second transistor having a second control terminal for receiving an input voltage and connected to the first transistor in cascode configuration at a common node;
a third transistor having a third control terminal coupled to the common node and further having a conduction terminal coupled in negative feedback to the first control terminal;
a biasing resistor connected to the first control terminal; and
a reference voltage source coupled in series with the biasing resistor.

15. The circuit of claim 14 wherein the first transistor is a MOS device and the second and third transistors are bipolar devices.

16. The circuit of claim 14 wherein the second and third transistors are each connected in a common-emitter type configuration.

17. The circuit of claim 14 further including a current source coupled in series at a second node with the biasing resistor and a decoupling capacitor coupled to the second node.

18. The circuit of claim 14 further including a current source coupled between an emitter terminal and ground of each of the second and third transistors.

19. The circuit of claim 18 further including a decoupling capacitor coupled between each emitter terminal and ground.

20. The circuit of claim 14 wherein the first, second and third transistors form one half of a differential amplifier circuit.

21. The device according to claim 1, wherein the auxiliary amplifier stage comprises an auxiliary transistor, further comprising an auxiliary resistor connected to a collector of this auxiliary transistor.

22. A radiofrequency amplifier device, comprising:
a transconductor stage comprising a first transistor having first and second conduction terminals and a control node for receiving a radiofrequency signal;
a cascode stage comprising a second transistor having first and second conduction terminals and a control node, the first conduction terminal of the second transistor being connected to the second conduction terminal of the first transistor, the second conduction terminal of the second transistor forming an output of the device; and
an auxiliary radiofrequency amplifier compensation stage comprising a third transistor having first and second conduction terminals and a control node, the first conduction terminal and control node of the third transistor being connected to the control node and first conduction terminal of the second transistor to form a negative-feedback loop.

* * * * *